US012467141B2

(12) United States Patent
Jdira et al.

(10) Patent No.: US 12,467,141 B2
(45) **Date of Patent: *Nov. 11, 2025**

(54) INJECTOR CONFIGURED FOR ARRANGEMENT WITHIN A REACTION CHAMBER OF A SUBSTRATE PROCESSING APPARATUS

(71) Applicant: ASM IP Holding B.V., Almere (NL)

(72) Inventors: Lucian C. Jdira, Nieuw Vennep (NL); Chris G.M. de Ridder, Hoogland (NL)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/425,643

(22) Filed: Jan. 29, 2024

(65) Prior Publication Data

US 2024/0167158 A1 May 23, 2024

Related U.S. Application Data

(63) Continuation of application No. 17/534,604, filed on Nov. 24, 2021, now Pat. No. 11,891,696.

(60) Provisional application No. 63/119,216, filed on Nov. 30, 2020.

(51) Int. Cl.
*C23C 16/455* (2006.01)

(52) U.S. Cl.
CPC .............................. *C23C 16/45578* (2013.01)

(58) Field of Classification Search
CPC .. C23C 16/45578; F27B 5/16; F27B 17/0025; H01L 21/67098; H01L 21/67303
See application file for complete search history.

(56) References Cited

U.S. PATENT DOCUMENTS

| | | | | |
|---|---|---|---|---|
| 5,273,586 | A | 12/1993 | Kim et al. | |
| 2001/0052556 | A1 | 12/2001 | Ting et al. | |
| 2007/0034158 | A1* | 2/2007 | Nakaiso | H01L 21/67109 118/725 |
| 2008/0286981 | A1* | 11/2008 | Hasper | C23C 16/34 118/704 |
| 2012/0156886 | A1* | 6/2012 | Shirako | C23C 16/481 216/2 |
| 2019/0055652 | A1* | 2/2019 | Nadrag | C23C 16/45578 |
| 2020/0102652 | A1 | 4/2020 | Nagata | |

FOREIGN PATENT DOCUMENTS

| | | |
|---|---|---|
| TW | 472300 B | 1/2002 |

* cited by examiner

*Primary Examiner* — Aiden Lee
(74) *Attorney, Agent, or Firm* — Snell & Wilmer L.L.P.

(57) ABSTRACT

The invention relates to an injector configured for arrangement within a reaction chamber of a substrate processing apparatus to inject gas in the reaction chamber. The injector may be elongated along a first axis and configured with an internal gas conduction channel extending along the first axis and provided with at least one gas entrance opening and at least one gas exit opening. The injector may have a width extending along a second axis perpendicular to the first axis substantially larger than a depth of the injector extending along a third axis perpendicular to the first and second axis. The wall of the injector may have a varying thickness.

18 Claims, 6 Drawing Sheets

INJECTOR CONFIGURED FOR ARRANGEMENT WITHIN A REACTION CHAMBER OF A SUBSTRATE PROCESSING APPARATUS

CROSS-REFERENCE TO RELATED APPLICATIONS

This application is a continuation of, and claims priority to, U.S. patent application Ser. No. 17/534,604 filed Nov. 24, 2021 and titled INJECTOR CONFIGURED FOR ARRANGEMENT WITHIN A REACTION CHAMBER OF A SUBSTRATE PROCESSING APPARATUS; which claims priority to U.S. Provisional Patent Application Ser. No. 63/119,216 filed Nov. 30, 2020 and titled INJECTOR CONFIGURED FOR ARRANGEMENT WITHIN A REACTION CHAMBER OF A SUBSTRATE PROCESSING APPARATUS, the disclosures of which are hereby incorporated by reference in its entirety.

FIELD

The present invention relates to an injector configured for arrangement within a reaction chamber of a substrate processing apparatus to inject gas in the reaction chamber. The injector may be substantially elongated along a first axis and configured with an internal gas conduction channel extending along the first axis and provided with at least one gas entrance opening and at least one gas exit opening. The injector may have a width extending along a second axis perpendicular to the first axis substantially larger than a depth of the injector extending along a third axis perpendicular to the first and second axis.

BACKGROUND

A substrate processing apparatus such as a vertical furnace for processing substrates e.g. semiconductor wafers may include a heating element, placed around a bell jar-shaped process tube. The upper end of the process tube may be closed, for example by a dome-shaped structure, whereas the lower end surface of the process tube may be open.

The lower end may be partially closed by a flange. An interior bounded by the tube and the flange forms a reaction chamber in which wafers to be treated may be processed. The flange may be provided with an inlet opening for inserting a wafer boat carrying wafers into the reaction chamber. The wafer boat may be placed on a door that is vertically moveably arranged and that is configured to close off the inlet opening in the flange.

The flange may support one or more injectors to provide a gas to the reaction chamber. For this purpose the injector may be configured with the internal gas conduction channel. Additionally, a gas exhaust duct may be provided in the flange. This gas exhaust may be connected to a vacuum pump for pumping off gas from the reaction chamber. The gas provided by the injectors in the reaction chamber may be a reaction (process) gas for a deposition reaction on the wafers. This reaction gas may also deposit on other surfaces than the wafers, for example it may deposit in the internal gas conduction channel. Layers created by these deposits may cause clogging and or breakage of the injectors.

SUMMARY

Accordingly an improved injector may be required.

In an embodiment there may be provided an injector configured for arrangement within a reaction chamber of a substrate processing apparatus to inject gas in the reaction chamber, the injector being substantially elongated along a first axis and configured with an internal gas conduction channel extending along the first axis and provided with at least one gas entrance opening and at least one gas exit opening, and the injector has a width extending along a second axis perpendicular to the first axis substantially larger than a depth of the injector extending along a third axis perpendicular to the first and second axis, wherein the wall of the injector has a varying thickness.

The various embodiments of the invention may be applied separate from each other or may be combined. Embodiments of the invention will be further elucidated in the detailed description with reference to some examples shown in the figures.

BRIEF DESCRIPTION OF THE FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

In this application similar or corresponding features are denoted by similar or corresponding reference signs. The description of the various embodiments is not limited to the examples shown in the figures and the reference number used in the detailed description and the claims are not intended to limit what is described to the examples shown in the figures.

Figure 1:
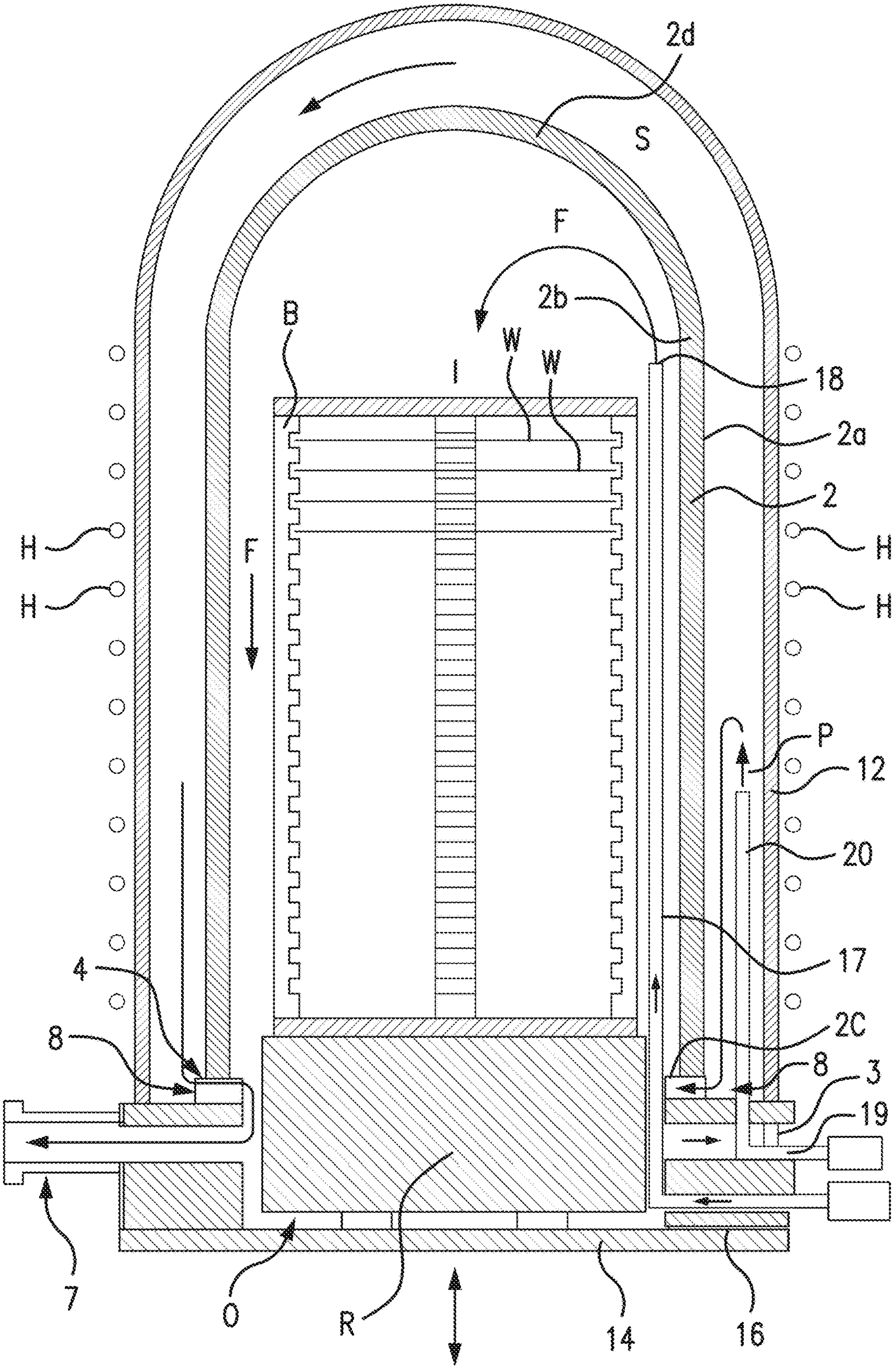
FIG. 1 shows a cross-sectional view of a tube of a vertical furnace including an injector.

FIG. 1 shows a cross-sectional view of a vertical furnace. The vertical furnace may comprise a process tube 12 forming a reaction chamber and a heater H configured to heat the reaction chamber. A liner 2 may be provided along the process tube 12, the liner 2 may comprise a substantially cylindrical wall delimited by a liner opening at a lower end and a dome shape top closure 2*d* at the higher end.

A flange 3 may be provided to at least partially close the opening of the process tube 12. A vertically movably arranged door 14 may be configured to close off a central inlet opening O in the flange 3 and may be configured to support a wafer boat B that is configured to hold substrates W. The door 14 may be provided with a pedestal R. The pedestal R may be rotated to have the wafer boat B in the reaction chamber rotating.

In the example shown in FIG. 1, the liner 2 may comprise a substantial cylindrical liner wall having an outer substantial cylindrical surface 2*a* and an inner substantial cylindrical surface 2*b*. The flange 3 may be configured to at least partially close the tube opening and the liner opening defined more precisely by the lower end surface 2*c* of the liner 2. The flange 3 comprises:

- an inlet opening O configured to insert and remove the boat B configured to carry substrates W in the reaction chamber I of the liner 2;
- a gas inlet 16 to provide a gas F, for example a process gas to the reaction chamber I; and,
- a gas exhaust duct 7 to remove gas from the reaction chamber I.

Figure 2:
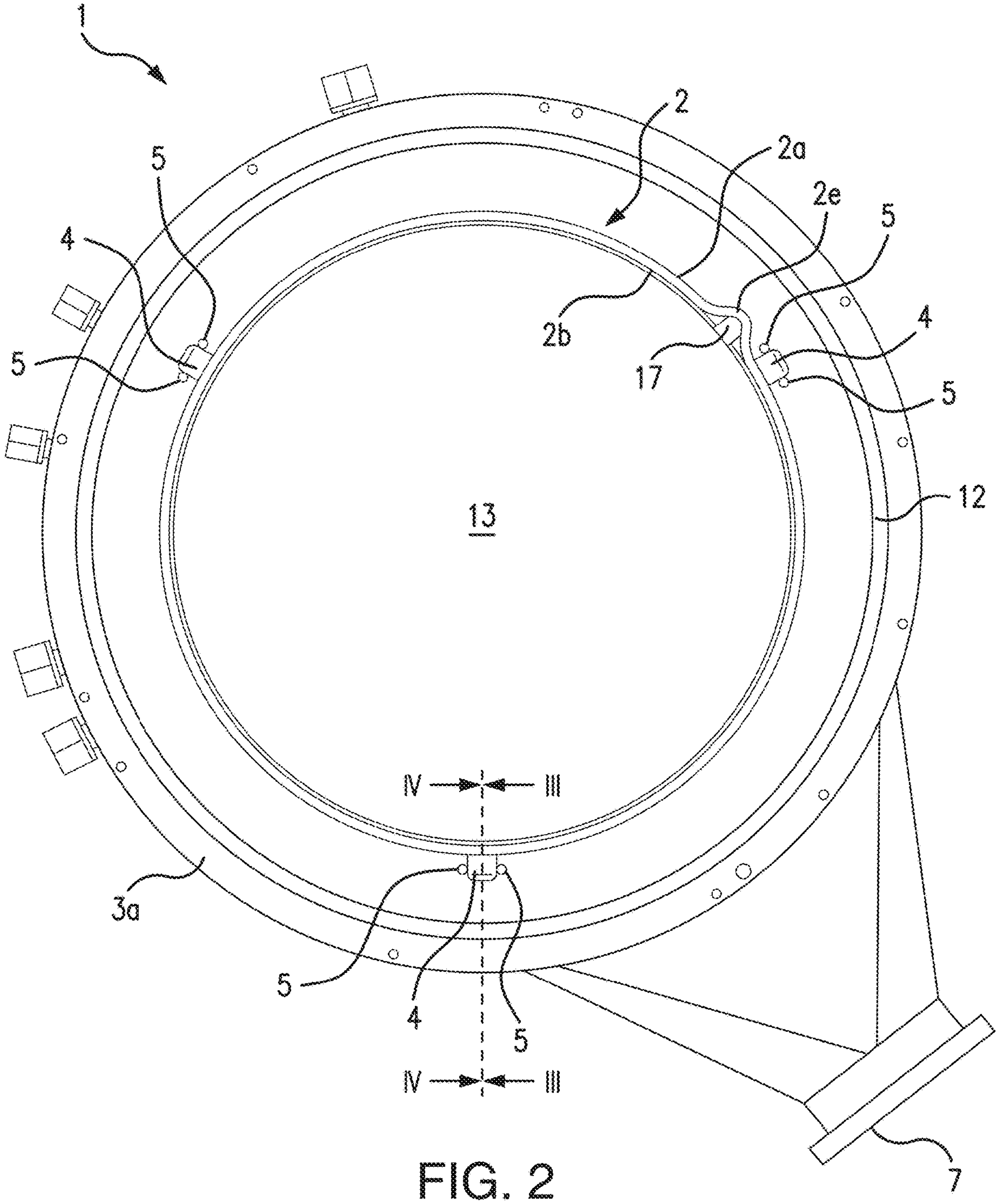
FIG. 2 shows a schematic top view of the tube of FIG. 1.

The substrate processing apparatus may have a vessel for containing silicon precursors and may be operably connected to an elongated injector 17 via the gas inlet 16. The injector 17 may be constructed and arranged to extend vertically into the reaction chamber I along the substantial cylindrical wall of the liner 2 towards a higher second end. The injector may be supported by the flange 3 at a lower first end of the injector and may comprising an injector opening to inject gas in the reaction chamber. One or more injectors 17 may be used to provide the process gas to the reaction chamber I. One injector 17 is shown in FIG. 2.

Gas exhaust duct 7 for removing gas from the reaction chamber I may be constructed and arranged below the injector opening 18. In this way a down flow F in the reaction chamber of the liner 2 may be created. This down flow F may transport contamination of reaction byproducts and particles from the substrate W, the boat B, the liner 2 and/or the support flange 3 downward to the exhaust duct 7 away from the processed substrates W.

The gas exhaust duct 7 for removing gas from the reaction chamber I may be provided below the liner opening of the liner 2. This may be beneficial since a source of contamination of the reaction chamber may be formed by the contact between the liner 2 and the flange 3. Again, the down flow F may transport the particles from the liner—flange interface downward to the exhaust away from the processed substrates.

The gas exhaust openings 8 may be constructed and arranged between the liner 2 and the flange 3 for removing gas from the circumferential space between the liner 2 and the tube 12. In this way the pressure in the circumferential space and the interior space I may be made equal and in a low pressure vertical furnace may be made lower than the surrounding atmospheric pressure surrounding the tube 12. The vertical furnace may be provided with a pressure control system to remove gas from the reaction chamber.

In this way the liner 2 may be made rather thin and of a relatively weak material since it doesn't have to compensate for atmospheric pressure. This creates a larger freedom in choosing the material for the liner 2. The thermal expansion of the material of liner 2 may be chosen such that it may be comparable with the material deposited on the substrate in the reaction chamber. The latter having the advantage that the expansion of the liner and the material deposited also on the liner may be the same. The latter minimizes the risk of the deposited material dropping of as a result of temperature changes of the liner 2.

The tube 12 may be made rather thick and of a relatively strong compressive strength material since it may have to compensate for atmospheric pressure with respect to the low pressure on the inside of the tube. For example, the low pressure process tube 12 can be made of 5 to 8, preferably around 6 mm thick Quartz. Quartz has a very low Coefficient of Thermal Expansion (CTE) of 0.59×10-6 K-1 (see table 1) which makes it more easy to cope with thermal fluctuations in the apparatus. Although the CTE of the deposited materials may be higher (e.g., CTE of Si3N4=3×10-6 K-1, CTE of Si=2.3×10-6 K-1) the differences may be relatively small. When films are deposited onto tube made of quartz, they may adhere even when the tube goes through many large thermal cycles however the risk of contamination may be increasing.

The liner 2 may circumvent any deposition on the inside of the tube 2 and therefore the risk of deposition on the tube 12 dropping off may be alleviated. The tube may therefore be made from Quartz.

A liner 2 of silicon carbide (CTE of SiC=4×10-6 K-1) may provide an even better match in CTE between deposited film and liner, resulting in a greater cumulative thickness before removal of the deposited film from the liner may be required. Mismatches in CTE result in cracking of the deposited film and flaking off, and correspondingly high particle counts, which is undesirable and may be alleviated by using a SIC liner 2. The same mechanism may work for the injector 17 however for injectors 17 it may be the case that the injector may be breaking if too much material with different thermal expansion is deposited. It may therefore be advantageously to manufacture the injector 17 from silicon carbide or silicon.

TABLE 1

Coefficient of Thermal Expansion (CTE) of Materials in Semiconductor Processing

| Material | Thermal expansion (ppm/K) |
|---|---|
| Quartz | 0.59 |
| Silicon nitride | 3 |
| Silicon | 2.3 |
| Silicon carbide | 4.0 |
| Tungsten | 4.5 |

Whether a material is suitable for the liner 2 and or the injector 17 may be dependent on the material that is deposited. It is therefore advantageously to be able to use material with substantially the same thermal expansion for the deposited material as for the liner 2 and/or the injector 17. It may therefore be advantageously to be able to use material with a thermal expansion for the liner 2 and/or the injector 17 relatively higher than that of quartz. For example Silicon Carbide SiC may be used. The silicon carbide liner may be between 4 to 6, preferably 5 mm thick since it doesn't have to compensate for atmospheric pressure. Pressure compensation may be done with the tube.

For systems depositing metal and metal compound materials with a CTE between about 4×10-6 K-1 and 6×10-6 K-1, such as TaN, HfO2 and TaO5, the liner and injector materials preferably may have a CTE between about 4×10-6 K-1 and 9×10-6 K-1, including, e.g., silicon carbide.

For deposition of material with even a higher CTE, the liner and/or injector materials may be chosen as for example depicted by table 2.

TABLE 2

Coefficient of Thermal Expansion (CTE) of Ceramic Construction Materials

| Material | Thermal expansion (ppm/K) |
|---|---|
| Macor | 12.6 |
| Boron Nitride | 11.9 |
| Glass, ordinary | 9 |
| Mullite | 5.4 |

Within the tube 12 a purge gas inlet 19 may be provided for providing a purge gas P to the circumferential space S between an outer surface of the liner 2*b* and the process tube 12. The purge gas inlet comprises a purge gas injector 20 extending vertically along the outer surface of the cylindrical wall of the liner 2 from the flange 3 towards the top end of the liner. The purge gas P to the circumferential space S may create a flow in the gas exhaust openings 8 and counteract diffusion of process gas from the exhaust tube 7 to the circumferential space S as depicted by the arrows.

The flange 3 may have an upper surface. The liner 2 may be supported by support members 4 that may be connected to the outer cylindrical surface of the liner wall 2*a* and each have a downwardly directed supporting surface. The liner may also be supported directly on the upper surface of the flange 3 with it lower surface 2*c*, while allowing a gas exhaust opening 8 between the upper surface and the liner 2.

The supporting surfaces of the support members 4 may be positioned radially outwardly from the inner cylindrical surface 2*b* of the liner 2. In this example, the supporting surfaces of the supporting members 4 may be also positioned radially outwardly from the outer cylindrical surface 2*a* of the liner 2 to which they are attached. The downwardly directed supporting surface of the support members 4 may be in contact with the upper surface of the flange 3 and support the liner 2 while allowing a gas exhaust opening 8 between the upper surface and the liner 2.

The support flange 3 of the closure may include gas exhaust openings 8 to remove gas from the reaction chamber of the liner 2 and the circular spaces between the liner 2 and the low pressure tube 12. At least some of the gas exhaust 8 openings may be provided between the upper surface of the flange 3 and the liner 2. At least some of the gas exhaust openings may be provided near the liner opening. The gas exhaust openings 8 may be in fluid connection with a pump via exhaust duct 7 for withdrawing gas from the reaction chamber and the circumferential space between the process tube 12 and the liner 2.

FIG. 2 is a schematic top view of the tube of FIG. 1. The figure shows the liner 2 with the cylindrical wall defining an inner substantially cylindrical surface 2*b* and an outer substantially cylindrical surface 2*a* that form an opening 13 for inserting a boat configured to carry substrates.

Also visible are the support members 4. In this example, the liner 2 has three support members 4 that are equally spaced along the circumference of the outer cylindrical surface 2*a* of the liner 2. The flange may be provided with positioning projections 5 that extend upwards from the upper surface 3*a* of the flange. The positioning projections 5 may engage the support members 4 on a tangential end surface thereof. As a result, the positioning projections 5 have a centering function for the liner 2 relative to the support flange 3.

The liner 2 and the notches forming the support members 4 may be manufactured from quartz, silicon or silicon carbide. The liner 2 delimiting the reaction chamber may have a radially outwardly extending bulge 2*e* to accommodate the injector 17 or a temperature measurement system in the reaction chamber.

Figure 3:
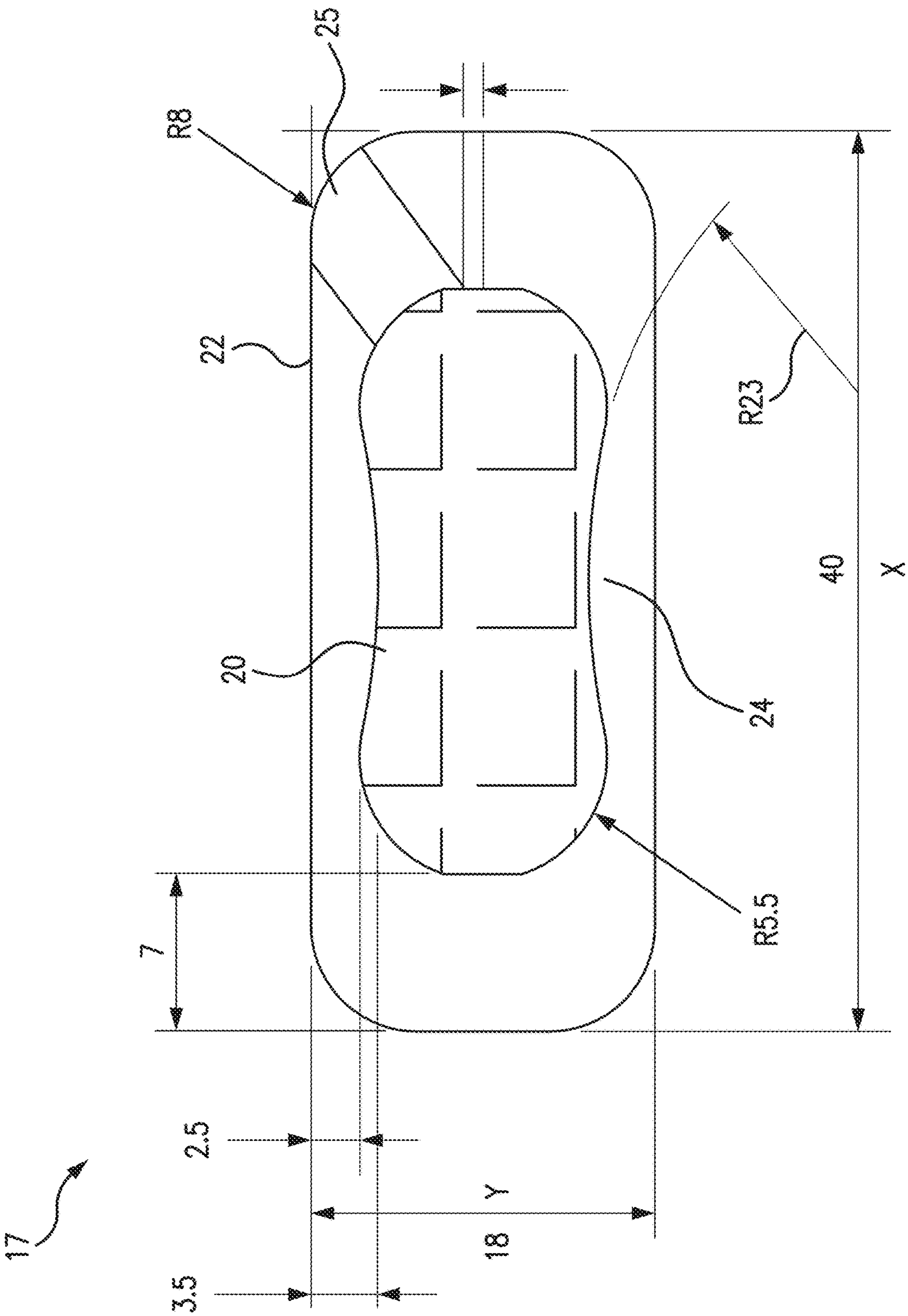
FIG. 3 shows a cross-section of an injector according to an embodiment for use in the vertical furnace of FIGS. 1 and 2.

FIG. 3 schematically shows a cross section of an injector 17 according to an embodiment for use in the vertical furnace of FIGS. 1 and 2. The injector 17 may be configured for arrangement within a reactor of a vertical furnace to inject gas in the reaction chamber I. The injector 17 may be configured with an internal gas conduction channel 20 to transport gas. The injector 17 may be substantial elongated along a first axis and the internal gas conduction channel 20 may extend along the first axis.

The injector 17 may have a width extending along a second axis X perpendicular to the first axis substantially larger than a depth of the injector extending along a third axis Y perpendicular to the first and second axis. The wall 22 of the injector 17 may have a varying thickness. The wall 22 of the injector 17 may have a varying thickness along the second axis X. The varying thickness of the wall 22 may vary between 10 to 60%. For example with 40% as depicted from 2.5 to 3.5 mm.

The internal gas conduction channel 20 of the injector 17 may have a substantially oval shaped cross section. The internal gas conduction channel 20 may extend along its width in the second axis X substantially larger than it extends along its depth in the third axis Y. The substantially oval shaped cross section may be build up out of a plurality of circles with a fixed radius to accommodate drilling and milling. Rounded corners also avoid the build-up of stress and contamination in the corners. The radius of the circles may be 1 to 10 mm, for example a circle having a radius of 5 mm. The horizontal inner cross-section area of the internal gas conduction channel 20 inside the injector 17 may be between 100 and 1500 $mm^2$, preferably between 200 and 500 $mm^2$ and most preferably between 250 and 350 $mm^2$.

The substantially oval shaped gas conduction channel 20 may be partially pinched off in the middle. Whereby pinched off means that the internal gas conduction channel 20 has a smaller depth in the third direction. The middle refers to the middle with respect to the width of the injector 17 in the second direction X. Pinching off may be accomplished by the wall 22 having the varying thickness. For example, by the 22 wall having an increased thickness in the middle of its width which pinches of the gas conduction channel 20.

The substantially oval shaped gas conduction channel 20 may be partially pinched off in the middle of the second direction by a bulb 24 making the wall 22 thicker and extending into and pinching off the gas conduction channel 20. The surface of the bulb 24 may be partially following a bulb circle. The bulb circle may have a constant radius with respect to an axis parallel to the first axis. The radius may be between 10 to 50 mm, preferably between 15 and 30 mm and as depicted it may be 23 mm.

The wall 22 of the injector 17 may have a varying thickness along the third axis Y. The varying thickness along the third axis Y may be relatively small variation around 7 mm.

The wall 22 of the injector 17 may have a varying thickness over its circumference along the second and third axis X, Y. The varying thickness of the wall 22 may vary between 4 to 60%.

The wall 22 of the injector 17 may have has a varying thickness along a substantial part of the first axis. In this way strength may be added where it is necessary.

The injector 17 may have a gas exit opening 25. The gas exit opening 25 may have a radius of 3 to 15 mm, preferably between 4 to 10 mm and most preferably between 5 and 9 mm, for example 8 mm.

Figures 4A, 4B, 4C:
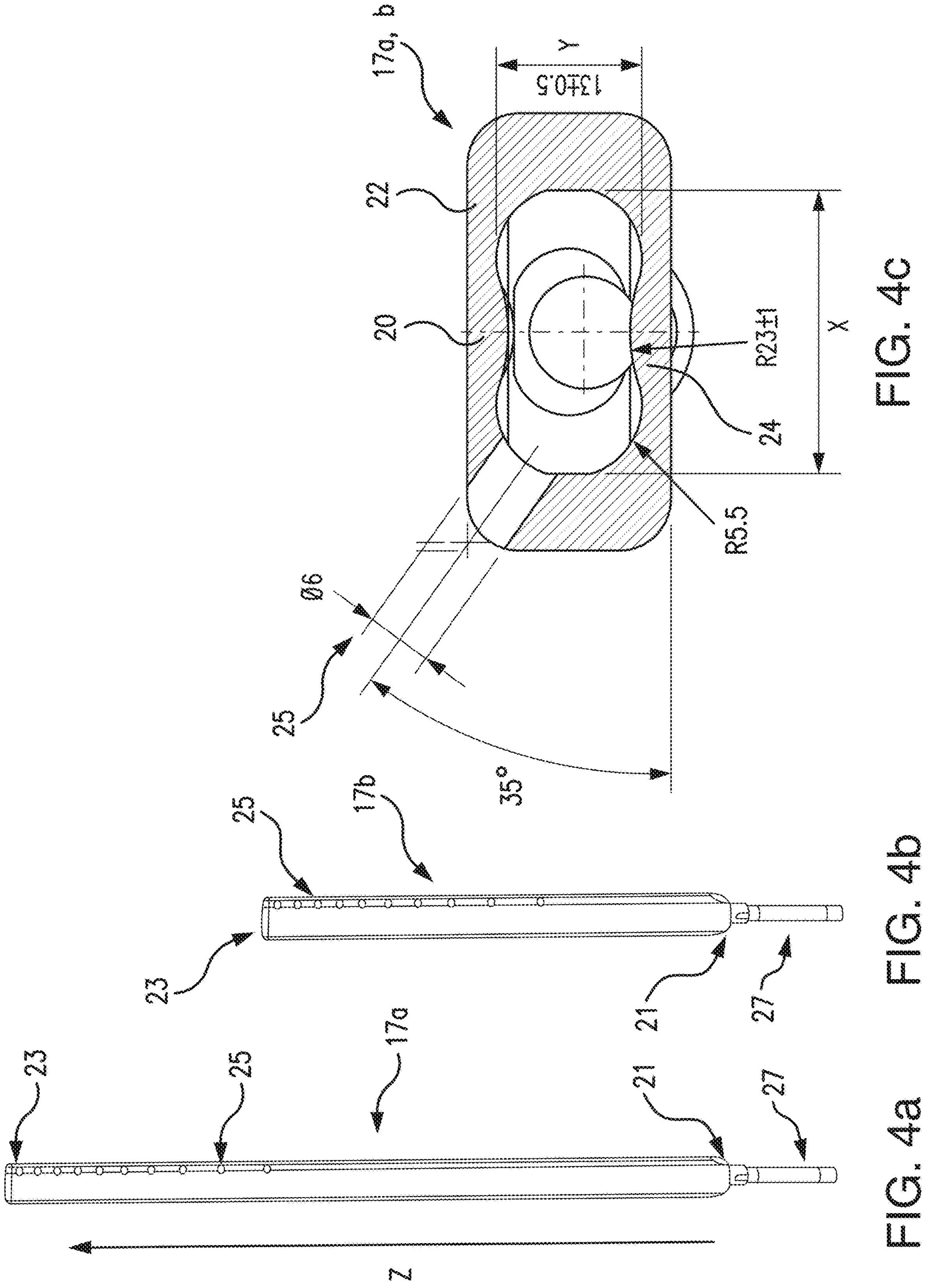
FIG. 4*a* to 4*e* schematically show injectors according to another embodiment for use in the vertical furnaces of FIG. 1; and, FIG. 5 depicts the injectors of FIG. 4*a* to 4*e* arranged in a tube.
Figure 4E:
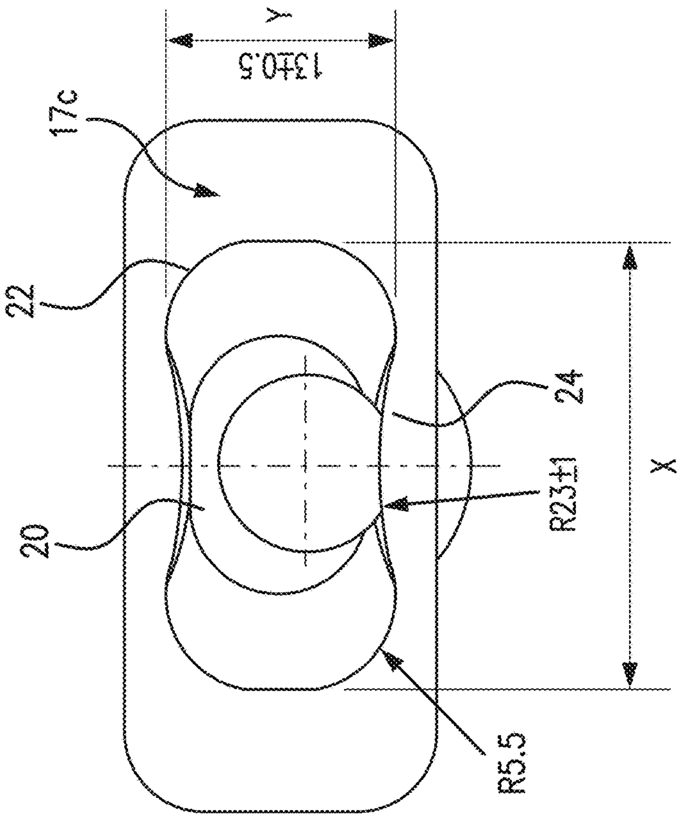
Figure 4D:
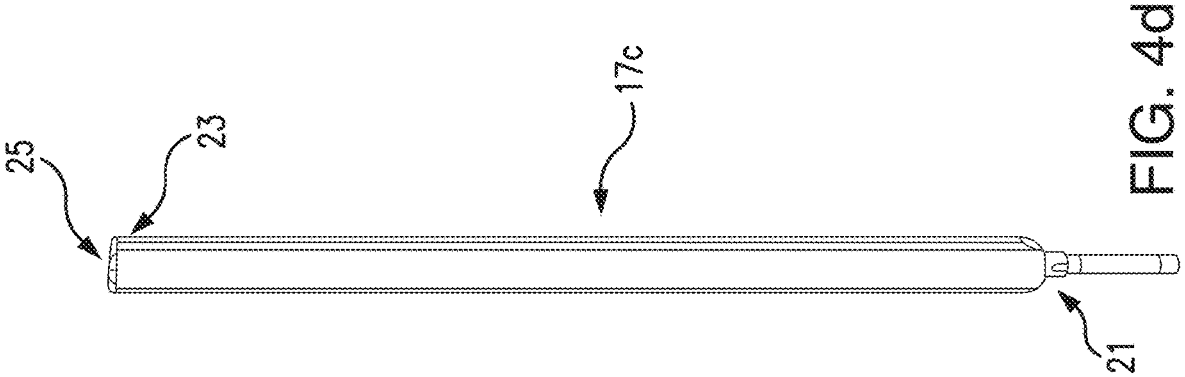
Figure 5:
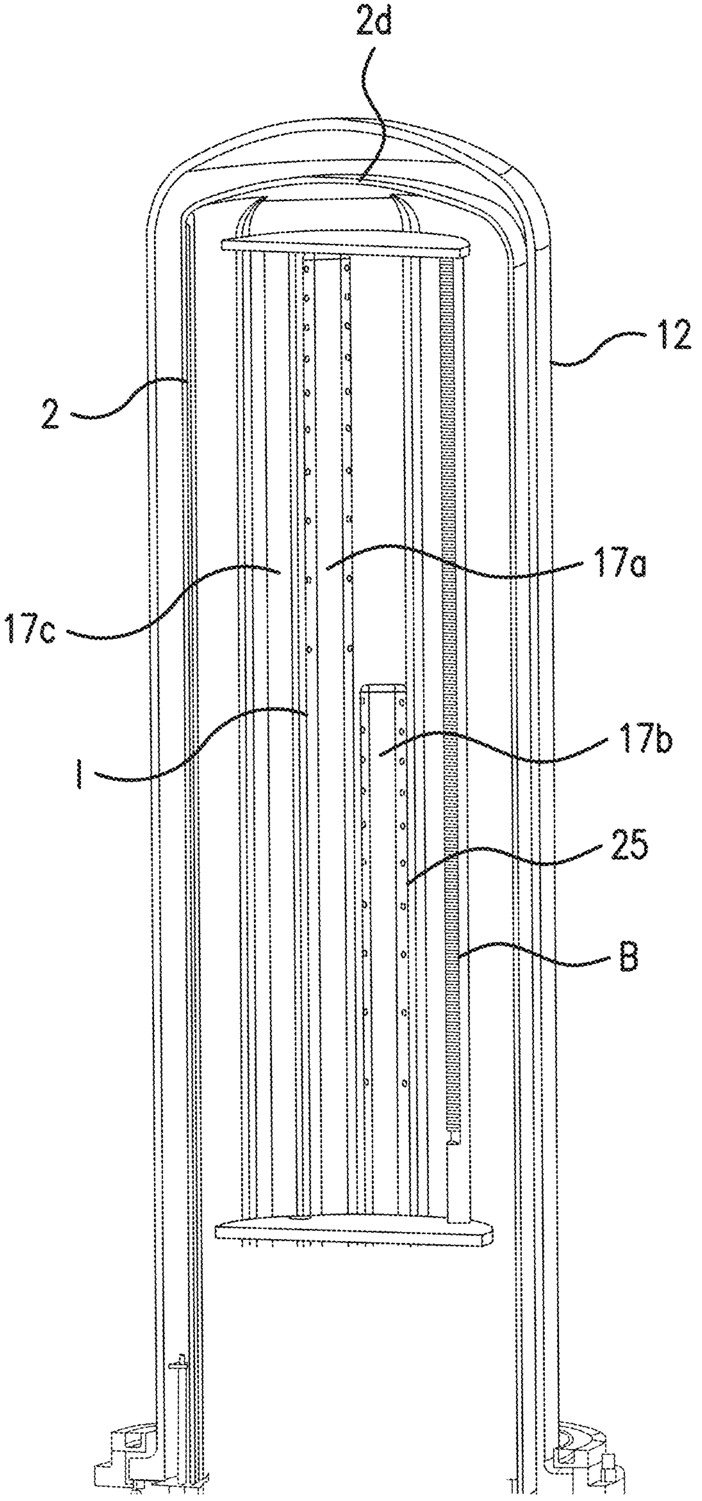

FIG. 4*a* to 4*e* schematically show injectors 17*a, b, c* according to another embodiment for use in the vertical furnace of FIGS. 1 and 5. The injectors 17*a, b, c* of FIG. 4*a* to 4*e* each may be specially configured to provide process gas at a particular height in the reaction chamber I. The injectors 17*a, b, c* of FIG. 4*a* to 4*e* may therefore be optimized to cooperate together as depicted in FIG. 5. Alternatively, each injector 17 may be used singularly as depicted in FIG. 2. The injectors 17*a, b, c* may be substantially elongated along a first axis Z.

The injectors 17*a, b, c* may be configured with an internal gas conduction channel 20 to transport process gas. The internal gas conduction channel 20 may extend along the first axis Z. The internal gas conduction channel 20 of the injector 17*a, b, c* may have a substantially oval shaped cross section.

The internal gas conduction channel 20 may extend along the second axis X between 10 to 50 mm, preferably between 20 and 30 mm, for example about 25 mm. The internal gas conduction channel 20 may extend along the second axis X substantially larger than the channel extends along the third axis Y. The internal gas conduction channel 20 may extend along the third axis Y between 8 to 30 mm, preferably between 10 and 20 mm, for example about 12 mm.

The substantially oval shaped cross section may be built up out of circles with a radius of 1 to 10 mm, for example a circle having a radius of 5 mm. This avoids straight corners in the gas conduction channel 20 because the corners then will have a minimal roundness of 1 to 10 mm for example 5 mm.

The horizontal inner cross-section area of the internal gas conduction channel 20 inside the injector 17 may be between 100 and 1500 $mm^2$, preferably between 200 and 500 $mm^2$ and most preferably between 250 and 350 $mm^2$.

The substantially oval shaped gas conduction channel 20 may be partially pinched off in the middle. Whereby pinched off means that the internal gas conduction channel 20 is smaller in the third direction Y. The middle refers to the middle with respect to the width of the injectors 17*a, b, c* in the second direction X. Pinching off may be accomplished by the 22 wall having an increased thickness in the middle.

The substantially oval shaped gas conduction channel 20 may be partially pinched off in the middle of the second direction by a bulb 24 provided to the wall 22 and extending into the gas conduction channel 20. The surface of the bulb 24 may be partially following a circle. The circle may have a constant radius with respect to an axis parallel to the first axis. The radius may be between 10 to 50 mm, preferably between 15 and 30 mm and as depicted it may be 23 mm.

The injectors 17*a, b, c* may have a width extending along a second axis X perpendicular to the first axis substantially larger than a depth of the injector extending along a third axis Y perpendicular to the first and second axis as depicted in FIG. 4*c*. The wall 22 of the injectors 17*a, b, c* may have a varying thickness.

The wall 22 of the injectors 17*a, b, c* may have a varying thickness along the third axis Y. The wall 22 of the injectors 17*a, b, c* may have a varying thickness over its circumference along the second and third axis X, Y. The wall 22 of the injectors 17*a, b, c* may have a varying thickness along a substantial part of the first axis X.

The injectors 17*a, b* may be so called multi hole injectors and have a plurality of gas exit holes 25 along their length in the direction of the second end 23 opposite to the first end 21 as depicted in FIGS. 4*a* and *b*. The gas exit opening 25 may have a radius of 3 to 15 mm, preferably between 4 to 10 mm and most preferably between 5 and 9 mm, for example 6 mm. The longer injector 17*a* of the plurality of injectors 17*a, b, c* may have multiple gas exit holes 25 as depicted in FIG. 4*a* and may extend within the interior to close to the top closure 2*d* (FIGS. 1 and 5) of the closed liner 2. The shorter injector 17*b* of the plurality of injectors 17*a, b, c* may have multiple gas exit holes 25 as depicted in FIG. 4*b* and extend to the middle of the boat B.

The size of the gas conduction channel 20 may be smaller at the first end 21 where the injectors 17*a, b, c* may connect to the gas inlet 16 near the flange 3. Since the temperature is lower near the first end 21 less process gas is deposited in the internal channel 20 near the first end 21.

The depth of the injectors 17*a, b, c* in the third direction Y may be decreasing towards the second end 23. The injector which extends within the interior I to close to a top closure 2*d* of the closed liner 2 may have a shape with a dimension in a direction in a radial direction which is decreasing closer to the top closure in FIG. 1.

The injectors 17*a, b, c* of FIGS. 4*a* to 4*e* each may be specially configured to provide process gas at a particular height in the reaction chamber I. At least one of the injectors 17*a, b, c* may therefore have a different length.

The longer injectors 17*a, c* of the plurality of injectors 17 as depicted in FIGS. 4*a* and 4*e* may extend within the interior I to close to the top closure 2*d* of the closed liner 2 as depicted in FIGS. 1 and 5. The longer injector 17*c* of the plurality of injectors 17*a, b, c* may have a single gas exit hole 25 at the second end 23 as depicted in FIG. 4*d*. This injector may be called a dump injector 17*c* which is closed along its elongated length to have only one single process gas exit at its second end 23. FIG. 4*e* depicts the cross section of this dump injector which has the same properties as described in relation to FIG. 4*c* above except that there is no gas exit hole 25 on the side.

The single gas exit hole 25 at the second end 23 of the dump injector may have the same properties as described in relation to FIG. 4*c* above. The single gas exit hole 25 of the dump injector may be between 100 and 1500 $mm^2$, preferably between 200 and 500 $mm^2$ and most preferably between 250 and 350 $mm^2$. The injectors 17*a, b, c* of FIG. 4*a* to 4*e* may therefore be optimized to cooperate together as depicted in FIG. 5.

FIG. 5 depicts how the injectors 17*a, b, c* of FIGS. 4*a* to 4*e* may be arranged in a tube 2. The injector 17*a, b* may be the multihole injectors (see FIGS. 4*a* and *b*) provided with a series of exit openings 25 extending in the elongated direction along the injector 17*a, b* to transport gas out of the conduction channel into the reaction chamber I. The shorter injector 17*b* and/or the longer injector 17*a* of the plurality of injectors 17*a, b, c* may have multiple gas exit holes 25. The exit openings 25 may be substantially round. The series of exit openings 25 may be aligned along a line over the surface of the multihole injectors 17*a, b*.

The exit openings 25 may be configured such that gas is injected in at least two different directions substantially perpendicular to the elongated direction of the multi hole injector so as to improve mixing of the process gas in the reaction chamber I. The series of openings 25 may therefore be aligned along at least two lines over the surface of the injector 17. Whereas a first line with openings may be shown in FIGS. 4*a* and *b* a similar second line with openings 25 may be configured on the other side of the injector 17 as depicted in FIG. 5. The series of openings 25 along a first line may be configured such that gas is injected in a first direction and the series of openings 25 along a second line may be configured such that gas is injected in a second direction. The first and second direction may be under an angle between 30 to 180 degrees with each other.

Exit openings 25 may be provided pair-wise at the same height as depicted in FIG. 5. Alternatively, the exit openings 25 may be provided pair-wise at unequal height to improve the strength of the injector 17. The two exit openings may inject the gas in two directions, for example under an angle of about 90 degrees, to improve the radial uniformity.

The distance between the openings 25 of the series of openings may be constant when going from the first end 21 to the second end 23 of the multihole injector 17 in FIGS.

4*a* and *b*. Advantageously each exit opening 25 may have a substantial equal flow of process gas through the exit opening 25.

The distance between the exit openings 25 of the series of exit openings may also be designed such that it decreases when going from the first end 21 to the second end 23 of the multihole injector 17. The later may be beneficial to compensate for pressure loss when the processing gas is transported from the first end 21 to the second end 23.

The area of the exit openings for multihole injectors may be between 1 to 200 $mm^2$, preferably between 7 to 100 $mm^2$, more preferably between 13 and 80 $mm^2$. Larger openings may have the advantage that it takes longer for the openings to clog because of deposited layers within the openings. The number of exit openings 25 may be between 2 and 40, preferably 3 and 30, and more preferably 5 and 15.

The longer injector 17*c* of the plurality of injectors 17*a, b, c* may have a single gas exit hole at the second end as depicted in FIG. 4*d*. This injector 17*c* may be called a dump injector 17*c* which is closed along its elongated length to have only one single process gas exit at its second end near the top closure 2*d* of the liner. The single gas exit hole at the second end of the dump injector may have the same properties as described in relation to FIG. 4*d, e* above.

The exit opening 25 of the gas injector 17 may be configured to reduce clogging of the opening. The exit opening may have a concave shape from the inside to the outside. The concave shape with the surface area of the opening on a surface on the inside of the injector larger than the surface area of the exit opening 25 on the outside of the injector may reduce clogging. The larger area on the inside allows more deposition at the inner side where the pressure and therefore the deposition is larger. On the outside the pressure is reduced and therefore the deposition is also slower and a smaller area may collect the same deposition as a larger diameter on the inside.

Reducing the pressure with the injector may result in a reduction of the reaction rate within the injector 17 because the reaction rate typically increases with increasing pressure. An additional advantage of a low pressure inside the injector is that gas volume through the injector expands at low pressure and for a constant flow of source gas the residence time of the source gas inside the injector reduces correspondingly. Because of the combination of both, the decomposition of the source gases may be reduced and thereby deposition within the injector may be reduced as well.

The process gas that may be injected via the injector 17 in the reaction chamber I to deposit layers on the wafers W in the wafer boat B may also deposit on the internal gas conduction channel or on the outer surface of the injector 17. This deposition may cause tensile or compressive stress in the injector 17. This stress may cause the injector 17 to break which causes down time of the vertical furnace and/or damage to the wafers W. Less deposition within the injector therefore may prolong the lifetime of the injector 17 and make the vertical furnace more economical.

Temperature changes of the injector 17 may even increase these stresses. To alleviate the stress the injector may be made from a material which may have the coefficient of thermal expansion of the material deposited with the process gas. For example, the gas injector may be made from silicon nitride if silicon nitride is deposited, from silicon if silicon is deposited or from silicon oxide when silicon oxide is deposited by the process gas. The thermal expansion of the deposited layer within the injector may therefore better match the thermal expansion of the injector, decreasing the chance that the gas injector may break during changes of temperature.

Silicon carbide may also be a suitable material for the injector 17. Silicon carbide has a thermal expansion which may match many deposited materials.

A disadvantage of a low pressure inside the injector is that the conduction of the injector decreases significantly. This would lead to a poor distribution of the flow of source gas over the opening pattern over the length of the injector: the majority of source gas will flow out of the holes near the inlet end of the injector.

To facilitate the flow of process gas inside the injector, along the length direction of the injector, the injector may be provided with an internal gas conduction channel with a large inner cross section. In order to be able to accommodate the injector according to the invention inside the reaction chamber, the tangential size of the injector 17 may be larger than the radial size and the liner 2 may be provided with an outwardly extending bulge to accommodate the injector.

In an embodiment the two source gases, providing the two constituting elements of the binary film, are mixed in the gas supply system prior to entering the injector. This is the easiest way to ensure a homogeneous composition of the injected gas over the length of the boat. However, this is not essential. Alternatively, the two different source gases can be injected via separate injectors and mixed after injection in the reaction chamber.

The use of two injector branches allows some tuning possibilities. When gas of substantially the same composition is supplied to both parts of the injector, via separate source gas supply, the flows supplied to the different injector branches can be chosen different to fine-tune the uniformity in deposition rate over the boat. It is also possible to supply gas of different composition to the two lines of the injector to fine-tune the composition of the binary film over the boat. However, the best results may be achieved when the composition of the injected gas was the same for both injector lines.

Since the injector 17 may be supported at its first end 21 by the flange 3 the injector 17 may wiggle a little bit at its second end 23 because it is a very long and thin structure as depicted in FIG. 1. It is therefore desirable or necessary to design the liner 2, injector 17 and the wafer boat B so that there is enough space between the three.

An outer side wall of the injector 17 may be tapered towards the second end 23 of the injector over at least 10%, preferably 30%, more preferably 50%, and even more preferable over 100% of its length. By having the injector 17 tapered at the second end 23 it may occupy less space in the small space between the liner 2 and the wafer boat in the reaction chamber I near its second end 23 where the tolerances are the tightest. The tolerances at which the injector 17 with its tapered second end 23 may be positioned in the small space may therefore be a bit more relaxed.

The injector extending within the interior to close to a top closure of the closed liner may therefore have a shape with a dimension in a direction in a radial direction which is decreasing closer to the top closure. Also in vertical furnaces where no liner 2 is used an injector 17 with a tapered shape at its second end 23 may be useful in relaxing the tolerances of positioning the injector in between the tube and the boat.

The injector 17 may comprise multiple branches, for example two branches, each provided with a separate gas feed conduit connection. One branch may inject process gas into the lower part of the reaction chamber and the other branch injects process gas into the upper part of the reaction chamber. The branches may be connected by connecting parts. However, it is not essential for the invention that the injector comprises two or more injector branches. The branches may be partially tapered at their second end.

The injector 17 may be manufactured from ceramics. The ceramics may be selected from siliconcarbide (SiC), siliconoxide (SiOx), silicon, or aluminumoxide (AlOx). The injectors may be manufactured in a process in which first the injector is formed and secondly the injector is baked to harden the ceramics.

Preceramic polymers may be used as precursors which may form the ceramic product through pyrolysis at temperatures in the range 1000-1100° C. Precursor materials to obtain silicon carbide in such a manner may include polycarbosilanes, poly(methylsilyne) and polysilazanes. Silicon carbide materials obtained through the pyrolysis of preceramic polymers may be known as polymer derived ceramics or PDCs.

Pyrolysis of preceramic polymers is most often conducted under an inert atmosphere at relatively low temperatures. The pyrolysis method is advantageous because the polymer can be formed into various shapes prior to pyrolysis into the ceramic siliconcarbide. Prior to pyrolysis the material is much softer and therefore easier to be shaped in a form.

The injector 17 may comprise a bottom portion connected to a top portion wherein the top portion may be slightly tapered and ends at the second end 23. The bottom portion may be between 30 and 40 cm long starting from the first end 21 and may be substantially straight.

The bottom portion may be provided with a connection pipe 27 (see FIG. 4*a, b*). The connection pipe 27 may be fitted in a hole in the flange 3 (in FIG. 1) to position and hold the injector 17. Such a construction on the first end 21 of the injector may be advantageously if the injector is heated because it allows for expansion of the injector 17. A disadvantage may be that it allows for some wiggling of the injector 17 especially at the second end 23.

By having the second end 23 tapered the tolerance for wiggling of the injector 17 may be increased. The top portion may have a cross sectional area at the second end 23 that is 1 to 80%, preferably 3 to 40%, and most preferably 4 to 20% smaller than the cross sectional area at the first end. The top portion may have a wall thickness at the second end that is 2 to 50%, preferably 5 to 30% and most preferably 10 to 20% than the wall thickness at the first end 21.

The injector 17 may have a cross sectional area at the second end that is 1 to 80%, preferably 3 to 40%, and most preferably 4 to 20% smaller than the cross sectional area at the first end. The injector may have a wall thickness at the second end 23 that is 2 to 50%, preferably 5 to 30% and most preferably 10 to 20% smaller than the wall thickness at the first end 21.

While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below. Various embodiments may be applied in combination or may be applied independently from one another.

What is claimed is:

1. An injector comprising:

a wall comprising an outer surface and an inner surface, wherein the inner surface defines an internal gas conduction channel extending along a first axis;

at least one gas entrance opening; and at least one gas exit opening, wherein the injector is substantially elongated along the first axis, wherein the internal gas conduction channel has a substantially oval shaped cross section whereby the internal gas conduction channel extends along a second axis substantially larger than along a third axis perpendicular to the first and second axis, wherein a thickness of the wall varies in a cross section of the wall surrounding the internal gas conduction channel, and wherein the substantially oval shaped cross section is partially pinched off in a middle of the second axis by a portion of the wall having an increased thickness.

2. The injector according to claim 1, wherein the wall of the injector has a varying thickness along the second axis.

3. The injector according to claim 1, wherein the wall of the injector has a varying thickness along the third axis.

4. The injector according to claim 1, wherein the wall of the injector has a varying thickness over its circumference along the second and third axis.

5. The injector according to claim 1, wherein the wall of the injector has a varying thickness along the first axis.

6. The injector according to claim 1, wherein the inner surface in the cross section comprises a first convex portion, a second convex portion, a first concave portion, and a second concave portion, wherein the first convex portion is connected to the first concave portion and the second concave portion, and the second convex portion is connected to the first concave portion and the second concave portion.

7. The injector according to claim 1, wherein the at least one gas entrance opening of the gas injector is a single gas entrance opening at a first end of the injector.

8. The injector according to claim 7, wherein the at least one gas exit opening of the gas injector is a single gas exit opening at a second end, opposite to the first end.

9. The injector according to claim 7, wherein the injector has a plurality of gas exit holes along a length of the injector along the first axis.

10. The injector according to claim 1, wherein a depth of the injector in the third axis is decreasing towards a second end.

11. The injector according to claim 1, wherein the thickness of the wall in the cross section varies between 4% to 60%.

12. The injector according to claim 1, further comprising a plurality of gas exit openings, wherein the plurality of gas exit openings are aligned along two vertical lines across a surface of the injector.

13. The injector according to claim 12, wherein the plurality of gas exit openings are provided in pairs along the two vertical lines.

14. A substrate processing apparatus comprising:

a tube;

a closed liner configured to extend in an interior of the tube;

a gas injector to provide a gas to the interior of the tube; and, a gas exhaust duct to remove the gas from the interior, whereby the closed liner comprises: a substantially cylindrical wall delimited by a liner opening at a lower end, a top closure at a higher end, and being substantially closed for gases above the liner opening, wherein the gas injector is the injector according to claim 1.

15. The substrate processing apparatus according to claim 14, wherein the apparatus comprises a plurality of gas injectors and at least one of the gas injectors has a different length.

16. The substrate processing apparatus according to claim 15, wherein the longest of the plurality of injectors extends within the interior to close to the top closure of the closed liner.

17. The substrate processing apparatus according to claim 15, wherein one of the longest of the plurality of injectors has a single gas exit hole.

18. The substrate processing apparatus according to claim 15, wherein one of the longest of the plurality of injectors has a plurality of gas exit holes.

* * * * *